United States Patent
DeCoux et al.

(10) Patent No.: US 10,301,717 B2
(45) Date of Patent: May 28, 2019

(54) ANTISTATIC COATING

(71) Applicant: Tru Vue, Inc., Faribault, MN (US)

(72) Inventors: James DeCoux, Faribault, MN (US); Roger Gave, Faribault, MN (US)

(73) Assignee: Tru Vue, Inc., Faribault, MN (US)

( * ) Notice: Subject to any disclaimer, the term of this patent is extended or adjusted under 35 U.S.C. 154(b) by 622 days.

(21) Appl. No.: 14/313,093

(22) Filed: Jun. 24, 2014

(65) Prior Publication Data

US 2014/0299464 A1     Oct. 9, 2014

Related U.S. Application Data

(62) Division of application No. 13/364,710, filed on Feb. 2, 2012, now abandoned.

(51) Int. Cl.
   *C23C 14/34* (2006.01)
   *G02B 1/14* (2015.01)
   (Continued)

(52) U.S. Cl.
   CPC .......... *C23C 14/34* (2013.01); *C03C 17/3417* (2013.01); *C23C 14/0036* (2013.01); *C23C 14/086* (2013.01); *C23C 14/54* (2013.01); *C23C 14/542* (2013.01); *C23C 14/58* (2013.01); *G02B 1/105* (2013.01); *G02B 1/14* (2015.01); *C03C 2217/94* (2013.01); *C03C 2217/944* (2013.01);
   (Continued)

(58) Field of Classification Search
   CPC .................................................... C23C 14/542
   See application file for complete search history.

(56) References Cited

U.S. PATENT DOCUMENTS

| | | |
|---|---|---|
| 222,279 A | 12/1879 | Johnson |
| 4,715,702 A | 12/1987 | Dillon |

(Continued)

FOREIGN PATENT DOCUMENTS

| | | | | |
|---|---|---|---|---|
| EP | 1184481 | 3/2002 | | |
| JP | 01087537 A | * 3/1989 | ........... | B64C 1/1492 |

(Continued)

OTHER PUBLICATIONS

Gordon, Roy G., "Criteria for Choosing Transparent Conductors", MRS Bulletin, Aug. 2000, www.mrs.org/publications/bulletin.

(Continued)

*Primary Examiner* — Jason Berman
(74) *Attorney, Agent, or Firm* — Dorsey & Whitney LLP (57) ABSTRACT

An antistatic article including a substrate having a first surface, a sputtered conductive layer arranged on the first surface and having a thickness ranging from approximately 0.5 nanometers to approximately 10 nanometers, and an outer layer or a series of layers arranged atop the sputtered conductive layer, wherein, the antistatic article exhibits a surface resistivity of less than approximately $10^{12}$ ohms/square. A method of making an antistatic article includes pretreating a surface of the substrate, sputtering the conductive layer onto the surface to a thickness ranging from approximately 0.5 nanometers to approximately 10 nanometers, and sputtering the outer layer and one or more additional layers atop the conductive layer, wherein, the antistatic article exhibits a surface resistivity of less than approximately $10^{12}$ ohms/square.

12 Claims, 5 Drawing Sheets

(51) Int. Cl.
*C23C 14/54* (2006.01)
*C03C 17/34* (2006.01)
*C23C 14/00* (2006.01)
*C23C 14/08* (2006.01)
*C23C 14/58* (2006.01)
*G02B 1/10* (2015.01)

(52) U.S. Cl.
CPC ....... *C03C 2217/948* (2013.01); *Y10T 428/26* (2015.01)

(56) References Cited

U.S. PATENT DOCUMENTS

| | | | |
|---|---|---|---|
| 5,362,552 A | | 11/1994 | Austin |
| 5,579,162 A | * | 11/1996 | Bjornard ............. C03C 17/3417 204/192.26 |
| 5,892,600 A | | 4/1999 | Kuo |
| 5,942,090 A | * | 8/1999 | Ebisawa ................ C03C 17/22 204/192.15 |
| 5,974,714 A | | 11/1999 | Jones |
| 6,153,060 A | * | 11/2000 | Pommer ............... C23C 14/022 134/1.1 |
| 6,764,580 B2 | | 7/2004 | Teng |
| 6,852,406 B2 | | 2/2005 | Marechal et al. |
| 2002/0068156 A1 | | 6/2002 | Suzuki et al. |
| 2005/0282139 A1 | | 12/2005 | Hughes |
| 2006/0266640 A1 | * | 11/2006 | Halsey, IV ............. G06F 3/044 204/192.29 |
| 2008/0028984 A1 | | 2/2008 | Meredith et al. |
| 2008/0192351 A1 | | 8/2008 | Miyagawa et al. |

FOREIGN PATENT DOCUMENTS

| | | |
|---|---|---|
| WO | WO 1997/035216 | 9/1997 |
| WO | WO 1998/032152 | 7/1998 |
| WO | WO 2005/044554 | 5/2005 |
| WO | WO 2006/014608 | 2/2006 |
| WO | WO 2011/136478 | 11/2011 |

OTHER PUBLICATIONS

The Free Dictionary (http://www.thefreedictionary.com/artwork)., 2013.

Merriam-Webster (http://www. merriam-webster.com/dictionary/specimen), 2013.

Second Australian Examination Report for Australian Patent Application No. 2013215079, dated Apr. 4, 2017 (3 pages).

European Office Action for European Application No. 13705309.6, dated Mar. 29, 2017 (7 pages).

* cited by examiner

ANTISTATIC COATING

FIELD OF THE INVENTION

The present application relates to coatings adapted to control static on substrates made of glass, acrylic, fiberglass, and other materials. More particularly, the present application relates to coatings on substrates such as glazing for framing or shadow boxing specimens such as artwork, memorabilia, documents or other types of specimens for display.

BACKGROUND

Combined anti-static and anti-reflective coatings are sometimes used on glazing such as glass, acrylic, or other materials that are used for framing a specimen for display. The anti-static effect of the coating may help to reduce the attraction of dust or other particulate to the glazing during the framing process and, thus, introduction of these foreign materials into the framed assembly can be reduced or eliminated. In addition, the antistatic effect may help to preserve the integrity of the specimen by reducing tendencies to attract pigments in the specimen. The anti-reflective coating may be helpful for viewing of the specimen by reducing reflections and allowing for clearer viewing of the specimen by onlookers such as patrons to a museum, an art studio, conference, or other place of display. The combined anti-static and anti-reflective coating can be relatively expensive to produce and an anti-static coating alone may be desired.

SUMMARY

In one embodiment, an antistatic article is provided. The article may include a substrate having a first surface. A sputtered conductive layer may be arranged on the first surface and may have a thickness ranging from approximately 0.5 nanometers to approximately 10 nanometers. An outer layer or series of outer layers may be arranged atop the sputtered conductive layer and the antistatic article may exhibit a surface resistivity of less than approximately $10^{12}$ ohms/square.

In another embodiment, a method of making an antistatic article is provided. The antistatic article may include a substrate, a conductive layer, and an outer layer or series of outer layers and the method may include pretreating a surface of the substrate. The method may also include sputtering the conductive layer onto the surface to a thickness ranging from approximately 0.5 nanometers to approximately 10 nanometers. The method may also include sputtering an outer layer or series of layers atop the conductive layer and the resulting antistatic article may exhibits a surface resistivity of less than approximately $10^{12}$ ohms/square.

In another embodiment, an antistatic article having a substrate with a first surface, a conductive layer arranged on the first surface and having a thickness ranging from approximately 0.5 nanometers to approximately 10 nanometers, and an outer layer or series of outer layers arranged atop the conductive layer, wherein the antistatic article exhibits a surface resistivity of less than approximately 1012 ohms/square is formed by the following method. A surface of the substrate may be pretreated, a conductive layer may be sputtered onto the surface, and an outer layer or series of layers (e.g., outer layers) may be sputtered atop the conductive layer.

While multiple embodiments are disclosed, still other embodiments of the present disclosure will become apparent to those skilled in the art from the following detailed description, which shows and describes illustrative embodiments of the package. As will be realized, the various embodiments of the present disclosure are capable of modifications in various aspects, all without departing from the spirit and scope of the present disclosure. Accordingly, the drawings and detailed description are to be regarded as illustrative in nature and not restrictive.

BRIEF DESCRIPTION OF THE DRAWINGS

While the specification concludes with claims particularly pointing out and distinctly claiming the subject matter that is regarded as forming the various embodiments of the present disclosure, it is believed that the disclosure will be better understood from the following description taken in conjunction with the accompanying Figures.

DETAILED DESCRIPTION

The present application, in some embodiments, relates to an antistatic glazing for framing of artwork, documents, memorabilia, or other specimens. The antistatic glazing may include a coating similar to that used to produce antistatic and antireflective coatings, but with a largely reduced thicknesses. That is, it may include a conductive film and an overlying outer layer and may also include an additional one or more layers arranged between the outer layer and the conductive film. The conductive layer, for example tin oxide, may be largely reduced in thickness relative to antistatic and antireflective coatings. While the thickness or thicknesses are largely reduced, the resulting glazing may surprisingly remain antistatic and may be offered at a reduced cost when compared to antistatic and antireflective coated articles.

In one embodiment, the coating may be applied to a substrate with a sputtering process and the antistatic property of the reduced thickness coating described herein may be maintained at least in part due to the particular parameters used in the sputtering process. For example, in some embodiments, the oxygen provided during the sputtering process may be particularly controlled to eliminate or reduce free oxygen that may be present in the coating without such control. The eliminated or reduced free oxygen may allow the reduced thickness coating to provide an antistatic effect.

Figure 1:
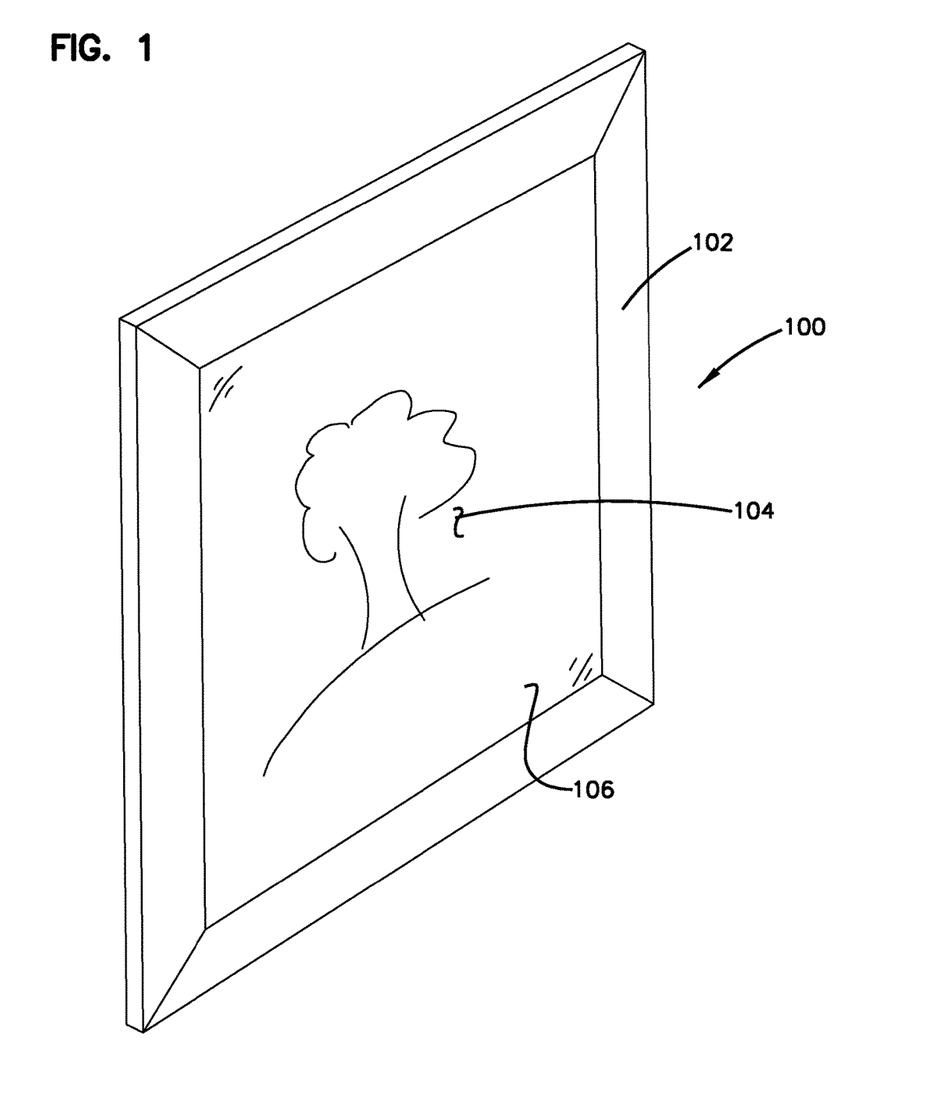
FIG. 1 is a perspective view of a specimen display with a coated substrate glazing.
Figure 2:
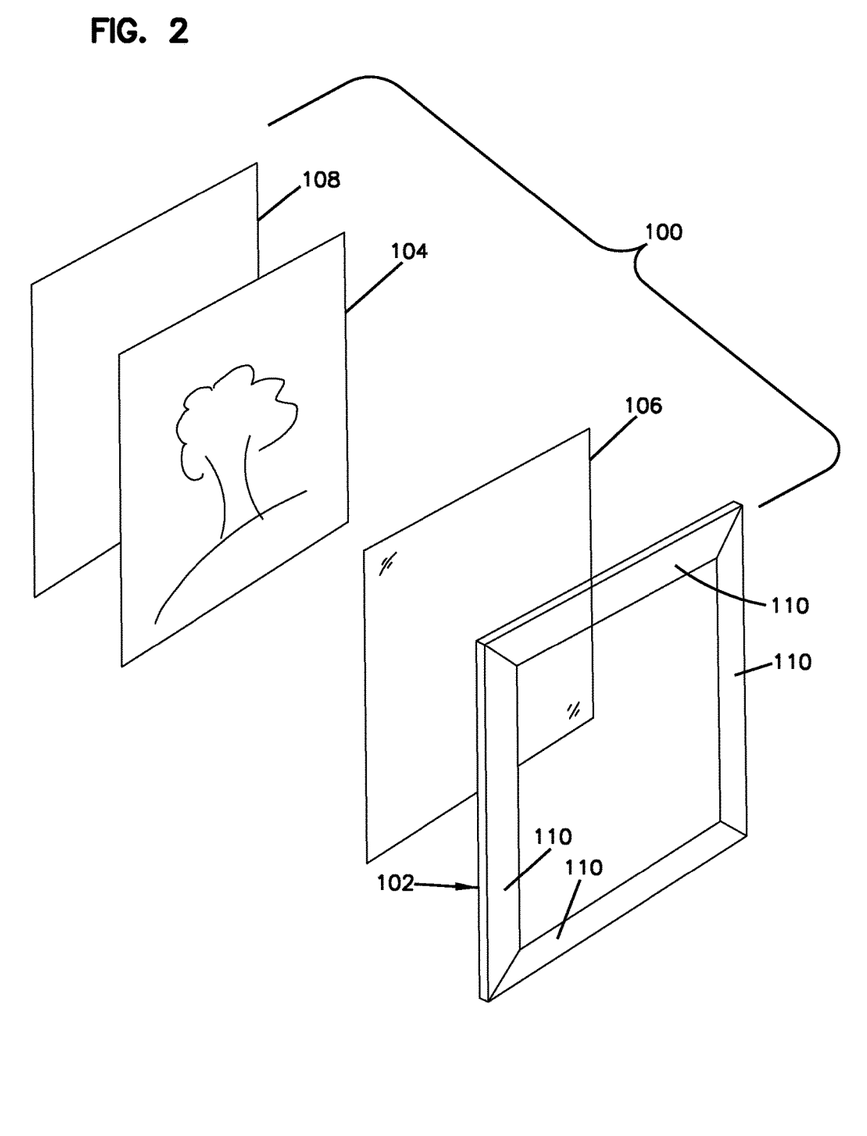
FIG. 2 is an exploded view thereof.

Referring to FIG. 1, a specimen display device 100 is shown including a frame 102, a specimen 104, and a glazing 106. In FIG. 2, the specimen display device 100 is shown in an exploded view revealing the backing 108 in addition to the frame 102, specimen 104, and glazing 106 of FIG. 1. In the embodiment shown in FIGS. 1 and 2, the glazing 106 may be in the form of a coated substrate 106. While the specimen display device 100 is shown as a piece of framed artwork, the specimen display device 100 may include other types of displays such as shadow boxes, display cases, display counters, display tables, and other specimen display systems or devices 100. It is also noted that while the presently described coated substrate 106 is described with respect to glazing 106 for display specimen devices 100, the coated substrate 106 may also be useful for television or computer display screens, overhead projectors, handheld device screens, and other applications where static is not desirable.

The frame 102 of the specimen display device 100 may include four side members 110 or another number of side members 110 may be provided. The frame 102 and associated side members 102 may include a depth suitable for the specimen 104 to be displayed therein. The frame side members 110 may have a substantially rectangular cross-section and may be joined at intersections with adjacent side members 110. The side members 110 may be miter cut at the intersections to form corners or angular transitions. Internal or external connectors such as biscuits, brackets, and the like may be used. The side members 110 may also have alternative cross-sections and may intersect with butt joints or other intersecting arrangements. The cross-section of the side members may include a keeper lip extending inward toward opposing side members 110 and may be generally aligned with a front surface of the side members 110. The keeper lip may allow the glazing 106, specimen 104, and backing 108 to be inserted into the frame 102 from the rear of the frame 102 and the glazing 106, specimen 104, and backing 108 may be secured in the frame 102 with operable tabs, flaps, rotating hands, or other devices commonly used in framing. Alternatively, a more permanent backing 108 may be provided. The side members 110 may also include one or more additional stepped keeper lips for setting the specimen 104 back from the backside of the glazing 106, for example. Still other arrangements and specimen display devices 100 may be used.

The specimen 104 may be anything that is desired to be placed on display including artwork, documents, memorabilia, and other types of specimens 104. In some embodiments, the specimen 104 may be high-end artwork and the antistatic glazing 106 may be desirable to reduce a tendency for the glazing 106 to attract pigments from the specimen 104 and, as such, damage or otherwise modify the specimen 104. In some cases, the specimen 104 may include pastel coloring, or charcoal or chalk based artwork. In still other embodiments, the specimen 104 may be documents and may be old or historical documents or newer documents that are desired to be kept for extended periods of time. In still other embodiments, the specimen 104 may be photos, certificates, awards, portraits, diplomas, or any other type of specimen 104 that is desired to be displayed and/or generally protected.

Figure 3:
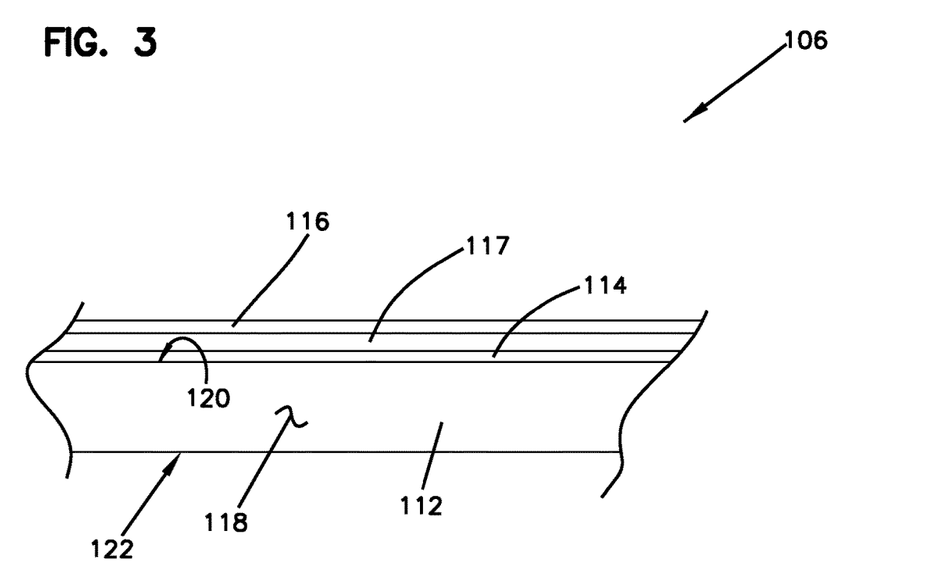
FIG. 3 is a cross-sectional view of the coated substrate according to some embodiments.

Referring to FIG. 3, a cross-sectional view of the glazing 106 of FIGS. 1 and 2 is shown. As shown, the glazing 106 may be in the form of a coated substrate 106 that may be sized, shaped, and oriented for arrangement on or in the specimen display device 100. The coated substrate 106 may be configured to protect the specimen 104 arranged in the specimen display device 100 and allow for viewing of the specimen 104. The coating on the coated substrate 106 may cause the coated substrate 106 to have antistatic properties. The coated substrate 106 may include a substrate 112 having a conductive film 114 arranged on a surface thereof and an outer film 116 arranged atop the conductive film 114 and one or more additional films or layers 117, may also be provided.

The substrate 112 may include a body portion 118 having an inner surface 120 and an outer surface 122. For purposes of discussion, the inner surface 120 may be defined as the surface having the coating applied thereto and the outer surface 122 may be the surface opposite to the inner surface 120. This description is selected because, in one embodiment, the coated side may face the specimen 104 in the specimen viewing device 100 leaving the opposite side to face outward, for example. However, other uses and arrangements may be provided such that the coated surface faces outward and the present application should not be limited in this respect.

The body portion 118 of the substrate 112 may be generally flat and plate-like such that the inner surface 120 and the outer surface 122 are generally parallel to one another. In other embodiments, the body portion 112 may be curved similar to a lens, for example, and the inner and outer surfaces 120, 122 may be concave and convex, respectively, or convex and concave, respectively. In still other embodiments both inner and outer surfaces 120, 122 may be concave or both inner and outer surfaces 120, 122 may be convex. Still further, the degree of curvature of the inner and outer surfaces 120, 122 may be the same or different from one another. In still other embodiments, one of the inner and the outer surface 120, 122 may be generally flat and the other surface may be curved. Still other surface arrangements may include wavy surfaces or cross-sections, textured surfaces, and the like.

The substrate 112 may be made of one of several materials or a combination of materials may be used. In one embodiment, the substrate 112 is an acrylic material. In other embodiments, the substrate 112 may be a glass, plastic, fiberglass, plexiglass, or polymer, for example. Still other materials may be used and the a suitable material may be selected based on the nature of the specimen 104, the desired viewing of the specimen 104, and the exposure conditions anticipated for the specimen 104.

The conductive film 114 may be configured to provide an antistatic property to the coated substrate 106 and may thus help to reduce the entrance of dust, debris, or other foreign matter when assembling the specimen display device 100. Moreover, the antistatic property may help to reduce damage to specimens 104 by reducing or eliminating the charge on the glazing 106 that may otherwise attract pigments, for example. The conductive film 114 may be arranged on the inner surface 120 of the body portion 118 of the substrate 112 and may be adapted to provide the coated substrate 106 with antistatic properties. The conductive film 114 may include tin oxide ($SnO_2$), zinc oxide (ZnO), or indium tin oxide (ITO), for example. In some embodiments, the conductive film may be a transparent conductive oxide and in other embodiments, a less transparent and more opaque or fully opaque film may be used. Other conductive film materials may also be used and combination of materials may also be provided.

In one embodiment, the conductive film 114 may include tin oxide ($SnO_2$) having a thickness ranging from approximately 0.25 nanometer to approximately 12 nanometers, for example. In another embodiment, the tin oxide may have a thickness ranging from approximately 1 nanometer to approximately 8 nanometers. In still other embodiments, the tin oxide may have a thickness ranging from approximately 2 nanometers to approximately 6 nanometers. In still other embodiments, the tin oxide may have a thickness of about 3, 4 or 5 nanometers or a thickness of about 7, 9, 10, or 11 nanometers. Thicknesses of a fraction of a nanometer or fractional values between the integer values mentioned may also be used. Where conductive film materials are provided other than tin oxide, similar thicknesses may be provided. Still further, other conductive film thicknesses outside the ranges provided may also be used. In some implementations, conductive film layers having a thickness of about 4 nanometers may meet specifications for optical properties (reflection level, transmission level, transmitted color).

The outer film 116 may be configured to protect the conductive film 114 and may allow for the conductive film 114 to maintain its antistatic property. With respect to protecting the conductive film 114, the outer film 116 may prevent or reduce scratching or marring of the conductive film 114, for example, or may help to make the coated substrate 106 more hydrophobic. With respect to maintaining the antistatic property of the conductive film 114, the outer film 116 may protect the conductive film 114 from exposure to moisture, for example, which may affect the resistivity of the conductive film 114. In other embodiments, the outer film or layer 116 may be configured to enhance the product. The outer film 116 may be arranged on the conductive film 114. The outer film may include silicon dioxide ($SiO_2$), titanium dioxide ($TiO_2$), or zirconium dioxide ($ZrO_2$), for example. Other outer films may also be used.

In one embodiment, the outer film 116 may include silicon dioxide ($SiO_2$) having a thickness ranging from approximately 1 nanometer to approximately 60 nanometers, for example. In another embodiment, the silicon dioxide may have a thickness ranging from approximately 2.5 nanometer to approximately 55 nanometers. In still other embodiments, the silicon dioxide may have a thickness ranging from approximately 5 nanometers to approximately 30 or to approximately 50 nanometers. In still other embodiments, the silicon dioxide may have a thickness ranging from 30 nanometers to approximately 50 nanometers or from 40 nanometers to approximately 50 nanometers. Thicknesses of a fraction of a nanometer or fractional values between the integer values mentioned may also be used. Where other outer film 116 materials are provided other than silicon dioxide, similar thicknesses may be provided.

In addition to the outer film 116, one or more additional layers 117 may also be provided. For example, an additional layer of titanium dioxide (TiO2) with a thickness ranging from approximately 0.25 nanometers to approximately 2 nanometers or from approximately 0.5 nanometers to approximately 1.5 nanometers or from approximately 0.75 nanometers to 1.25 nanometers, for example, may be provided. Other thicknesses and materials of additional layers may also be provided. More than one additional layer may also be provided. While FIG. 3 shows the one or more additional layers 117 provided between the conductive layer 114 and the outer film 116, the additional layers 117 may be provided atop the outer film 116. A suitable number and type of additional layers may be selected based on several factors including resistance to salt and humidity, making the coated substrate 106 more hydrophobic, and other factors. The one or more additional layers may be provided generally to enhance and protect the product with an effort to avoid adding significant cost, avoid increasing the reflection level, or negatively influencing the reflected and transmitted color.

Figure 4:
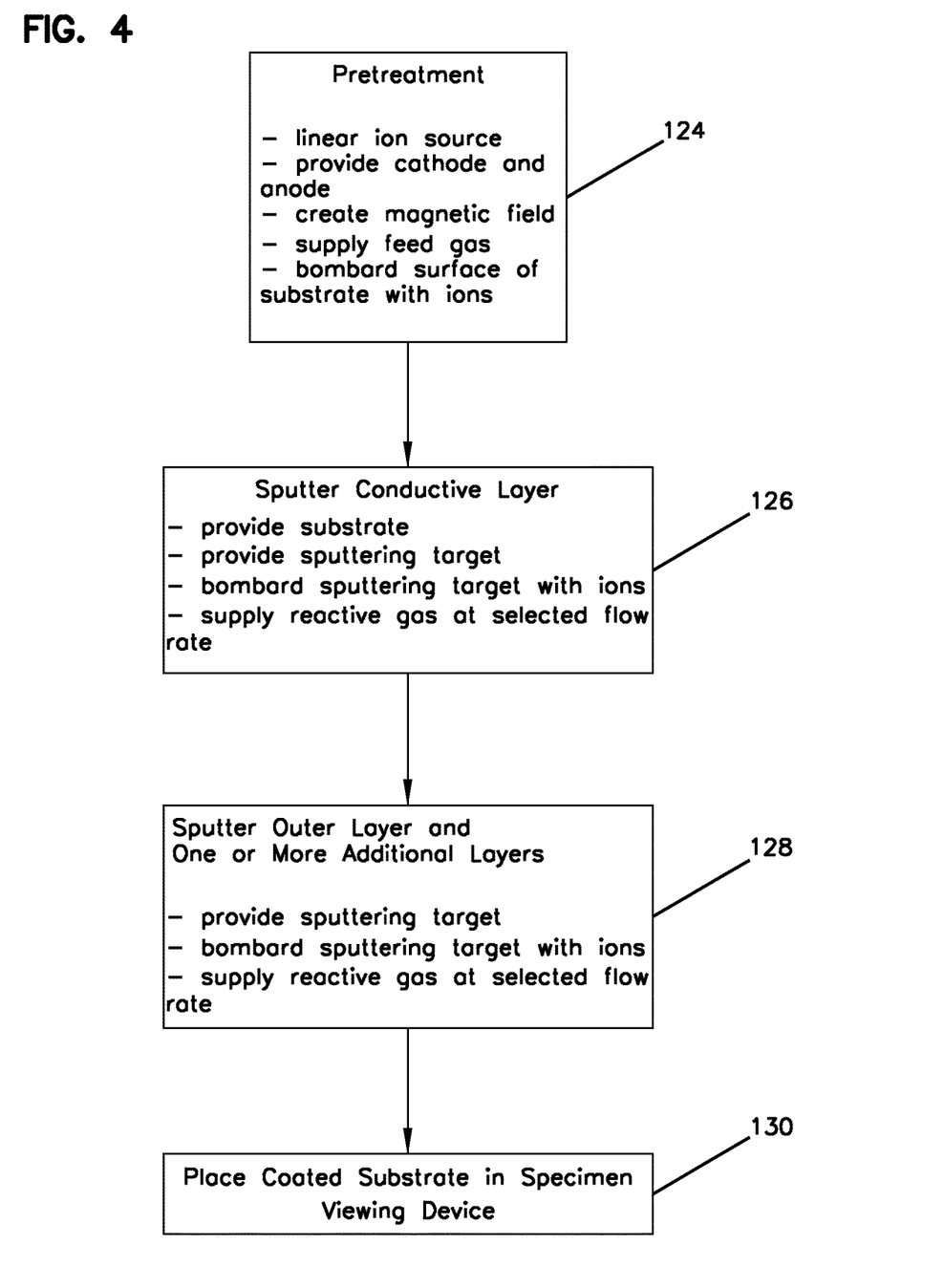
FIG. 4 is a flow chart of a process for applying the coating to the substrate of FIG. 3.

The coated substrate 106 may be made using one or a combination of several processes. FIG. 4 shows one embodiment of how a substrate 112 may be coated with an antistatic coating. The substrate may be pretreated (124), a conductive layer 114 may be applied to the substrate 112 (126), and an outer layer 116 and optionally one or more additional layers 117 may be applied over the top of the conductive layer 114 (128). In some embodiments, the coated substrate 106 may be placed in a specimen viewing device (130). While the operations are shown in the form of a flow chart, it is to be appreciated that one or more of the operations may be performed in another order and the invention should not be limited to the particular order shown.

The pretreatment process (124) may be adapted to ready the surface 120 of the substrate 112 to receive the conductive layer 114. In one embodiment, the pretreatment process (124) may include treating the surface 120 of the substrate 112 with a linear ion source. This process may include using permanent magnets to create a magnetic field around a cathode arranged in front of an anode. Gas, such as oxygen and/or argon may be fed through a manifold and electrons that are confined by the magnetic field may collide with the gas and ionize the gas. The positively biased anode may accelerate the ions to create an ion beam. The beam may be used to bombard the surface 120 of the substrate 112 to clean off contaminants and promote bonding of the conductive layer 114 to the substrate 112, for example. In one embodiment, the system used to provide the linear ion source is made by Advanced Energy, for example. Other linear ion source systems may also be used and methods other than linear ion source may also be used to pretreat the substrate 112. In some embodiments, for example, the surface 120 of the substrate 112 may be chemically cleaned using cleaning agents, such as cerium oxide, nickel oxide, or commercially available detergents. In other embodiments, the surface 120 of the substrate 112 may be pretreated by corona treatment (air plasma), glow discharge, or vacuum plasma treatment.

The conductive layer 114 may be applied to the pretreated surface 120 of the substrate 112 using a sputtering process (126). The sputtering process (126) may include arranging the substrate 112 in a chamber with a sputtering target having a negatively charged target surface. The negatively charged target surface may be bombarded with argon ions, for example, which ejects atoms from the target. The sputtering process (126) may also include the addition of a reactive gas for combining with the ejected atoms to form a compound. The formed compound may then be deposited on the surface 120 of the substrate 112.

In one embodiment, where the conductive layer 114 is tin oxide, the sputtering target may be a tin material and the reactive gas may be oxygen. As such, the bombarded tin sputtering target may eject tin atoms that combine with the oxygen gas to form tin oxide which is then deposited on the substrate 112. In some embodiments, the flow of oxygen gas may be controlled. For example, on a small scale development coater, the oxygen gas may range from approximately 20 standard cubic centimeters per minute (SCCM) to approximately 40 SCCM. In other embodiments, the flow of oxygen gas may range from approximately 25 SCCM to approximately 35 SCCM. In still other embodiments, the flow of oxygen may range from approximately 28 SCCM to approximately 30 SCCM. In still other embodiments, the flow of oxygen may be approximately 29 SCCM. On a larger scale production coater, relatively higher oxygen flows may be used. For example, the flow of oxygen gas may range from approximately 200 SCCM to approximately 400 SCCM or from approximately 250 SCCM to approximately 350 SCCM. In still other embodiments, the flow of oxygen may range from approximately 280 SCCM to approximately 300 SCCM. In still other embodiments, the flow of oxygen may be approximately 290 SCCM. In further embodiments, the total oxygen flow to the conductive layer may be about 175 SCCM. In some implementations, further reductions in oxygen flow in the production coater below 175 SCCM may result in a tin oxide layer with a suitable thickness and surface resistivity. Other integer values, and fractions thereof, of oxygen flow may also be provided within the mentioned ranges or outside the ranges.

Other factors associated with sputtering may also be considered to achieve a suitable coating thickness with the desired properties. For example, the pump efficiency may require that the flow be adjusted upward when efficiency is low, for example. In addition, for maintaining a substantially uniform coating the oxygen gas used in the sputtering process may be routed to particular areas of the chamber and the flow of oxygen to a given area may vary based on the size and location of the area. Still further, the replacement of sputtering targets may indicate that the oxygen flow be adjusted.

The outer layer 116 and the one or more additional layers 117 may also be applied using a sputtering process (128). In the case of a silicon dioxide outer layer 116/117, the sputtering target may be a silicon material and the reactive gas may be oxygen. As such, the bombarded silicon sputtering target may eject silicon atoms that combine with the oxygen gas to form silicon dioxide which is then deposited on the substrate 112. The flow of oxygen for the outer layer 116 or additional layers 117 formed atop the conductive layer 114, may be the same or different than the flows used for the conductive film layer. In some embodiments, the similar flows may be used and in other embodiments, much larger flows of oxygen may be used. In some implementations, the resulting silicon dioxide outer layer 116 or series of layers atop the conductive layer 114 may have a thickness of approximately 3 nanometers.

While the application of the conductive layer 114, the outer layer 116 and the one or more additional layers 117 have been described as being applied with a sputtering process, other methods of applying the layers 114, 116, 117 may also be used. In some embodiments, chemical vapor deposition may be used. In other embodiments ion assisted deposition may be used. In still other embodiments, high power impulse magnetron sputtering may be used. Still other methods of applying the layers 114, 116, 117 to the substrate may be provided.

Where the coated substrate 106 is to be used in a specimen display device 100 as described, the coated substrate 106 may be placed in the frame 102, the specimen 104 may be arranged behind the coated substrate 106 and may be placed against or spaced away from the coated surface 120 of the coated substrate 106. A backing material 108 may be applied to secure the specimen 104 in the frame 102.

As applicants developed the current coated substrate 106 and the process for making the coated substrate 106, several advantages were realized. First, previous antistatic and antireflective coatings included a substrate with a tin oxide coating having a thickness of approximately 35-45 nanometers overlaid with a silicon dioxide coating having a thickness of approximately 110-140 nanometers. At the time of the invention, those of skill in the art understood that the tin oxide layer provided the antistatic property and the combination of the tin oxide and silicon dioxide (or additional layers beyond the two) provided the antireflective property. In setting out to produce a less expensive antistatic product, applicants expected that the silicon dioxide layer could be omitted since there was no longer a need for an antireflective property. Still further, since similar antistatic properties were desired, applicants expected that a similar tin oxide thickness would be needed. Both of these expectations turned out not to be true.

Figure 5:
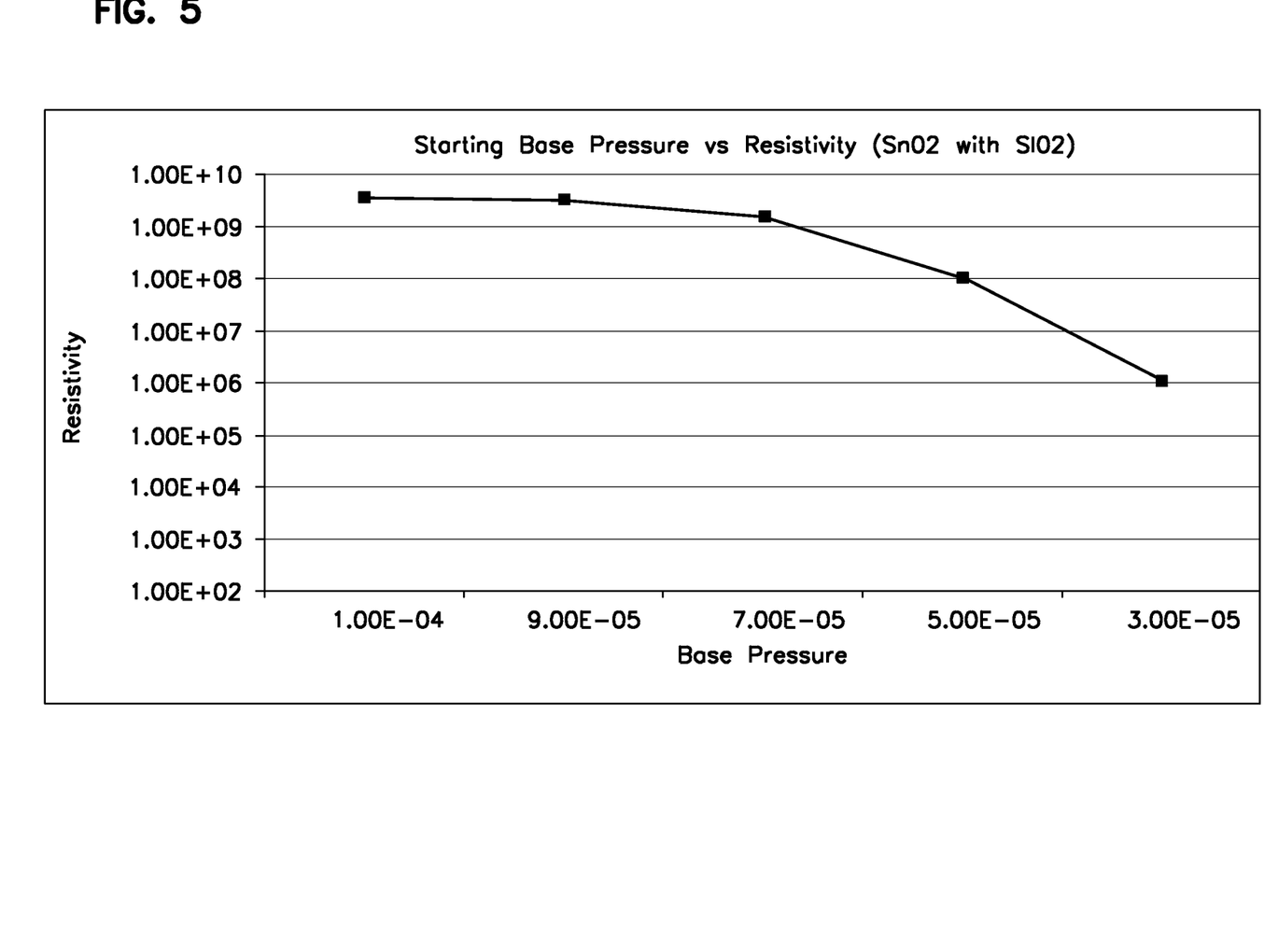
FIG. 5 is a graph showing the how changes in base pressure affects surface resistivity.

First, a surprising result of applicant's development of the antistatic coated substrate 106 is that the tin oxide layer tends to lose its antistatic property after time (e.g., several days) without the silicon dioxide layer. As such, while an antireflective property may not be desired, an outer coating may still be provided. Second, an additional surprising result of applicant's development included that the thickness of the conductive layer 114 could be reduced in thickness considerably in the absence of a requirement to make the coated substrate antireflective. Even with the reduced thickness of the conductive layer 114 (e.g., from 35-45 nanometers down to approximately 5 nanometers or approximately 10-15% as thick), the coated substrate 106 would still exhibit suitable antistatic properties of below $10^{12}$ ohms/square. In this regard, applicants also found that the control of the oxygen in the process of sputtering the conductive layer 114 affected the antistatic properties of the coated substrate 106 and, as such, may be at least one reason why such a thin layer of conductive material provides the desired antistatic effect. For example, in one embodiment on a development coater, the oxygen flow of 29 SCCM provides a surface resistivity of approximately $10^8$ ohms/square while oxygen flow of 28 SCCM provides a surface resistivity of $10^{11}$ ohms/square and 30 SCCM provides a surface resistivity of $10^{10}$ ohms/square. On the production coater, oxygen flows of approximately 300 SCCM may provide suitable surface resistivity. In another example, a reduction of oxygen flows to approximately 175 SCCM on the production coater may provide suitable surface resistivity. In comparison to oxygen flows of approximately 750 to 1000 SCCM for previous sputtering processes for applying conductive film layers, these flows are considerably less. In addition to oxygen flows affecting surface resistivity, the base pressure of a coating environment may affect surface resistivity. Accordingly, in some implementations, the substrate may be provided in a vacuum or in a low pressure environment prior to coating in order to yield the coated substrate 106 with the desirable surface resistivity. FIG. 5 is a graph showing the how changes in base pressure affects surface resistivity in an environment where gas flow, power and line speed are held constant. In some implementations, sputter coating surfaces at a base pressure of $5.5^{-5}$ to $6.0^{-5}$ may provide coatings, e.g., conductive layer 114, outer layer 116, the one or more additional layers 117 or each thereof, with a conductivity that falls in the $10^8$ ohms/square range.

In the foregoing description various embodiments of the present disclosure have been presented for the purpose of illustration and description. They are not intended to be exhaustive or to limit the invention to the precise form disclosed. Other modifications or variations are possible in light of the above teachings. The embodiments were chosen and described to provide the best illustration of the principals of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth they are fairly, legally, and equitably entitled.

What is claimed is:

1. A method of making an antistatic article having an acrylic substrate, a conductive layer, and at least one of an outer layer and a series of layers, the method comprising:
   pretreating a surface of the acrylic substrate;
   sputtering the conductive layer comprising one or more of tin oxide, zinc oxide, or indium tin oxide onto the surface to a thickness ranging from approximately 0.5 nanometers to approximately 10 nanometers; and
   sputtering the at least one of the outer layer and the series of layers atop the conductive layer, wherein the antistatic article exhibits a surface resistivity of less than approximately $10^{12}$ ohms/square.

2. The method of claim 1, wherein the conductive layer comprises tin oxide and the at least one of the outer layer and the series of layers comprises silicon oxide.

3. The method of claim 1, wherein sputtering the conductive layer further comprises supplying an oxygen gas at a selected rate.

4. The method of claim 3, wherein the selected rate ranges from approximately 20 standard cubic centimeters per minute to approximately 40 standard cubic centimeters per minute using a development coater.

5. The method of claim 3, wherein the selected rate ranges from approximately 25 standard cubic centimeters per minute to approximately 35 standard cubic centimeters per minute using a development coater.

6. The method of claim 3, wherein the selected rate ranges from approximately 28 standard cubic centimeters per minute to approximately 30 standard cubic centimeters per minute using a development coater.

7. The method of claim 3, wherein the selected rate is approximately 29 standard cubic centimeters per minute using a development coater.

8. The method of claim 1, wherein pretreating the surface of the acrylic substrate comprises using a linear ion source.

9. The method of claim 1, wherein pretreating the surface of the acrylic substrate comprises chemically cleaning the surface of the substrate.

10. The method of claim 1, wherein:
the outer layer comprises silicon dioxide, titanium dioxide, or zirconium dioxide; and
the series of layers comprises a titanium dioxide layer with a thickness between approximately 0.25 nm and approximately 2 nm.

11. A method of making an antistatic article having an acrylic substrate, a conductive layer, and at least one of an outer layer and a series of layers, the method comprising:
sputtering the conductive layer comprising one or more of tin oxide, zinc oxide, or indium tin oxide onto the surface to a thickness ranging from approximately 0.5 nanometers to approximately 10 nanometers; and
sputtering the at least one of the outer layer and the series of layers atop the conductive layer,
wherein the antistatic article exhibits a surface resistivity of less than approximately $10^{12}$ ohms/square; and
wherein the series of layers comprises a titanium dioxide layer with a thickness between approximately 0.25 nm and approximately 2 nm.

12. A method of making an antistatic article having an acrylic substrate, a conductive layer, and at least one of an outer layer and a series of layers, the method comprising:
sputtering the conductive layer comprising one or more of tin oxide, zinc oxide, or indium tin oxide onto the surface to a thickness ranging from approximately 0.5 nanometers to approximately 10 nanometers; and
sputtering the at least one of the outer layer and the series of layers atop the conductive layer,
wherein the antistatic article exhibits a surface resistivity of less than approximately $10^{12}$ ohms/square; and
wherein the outer layer comprises silicon dioxide, titanium dioxide, or zirconium dioxide.

* * * * *

UNITED STATES PATENT AND TRADEMARK OFFICE
CERTIFICATE OF CORRECTION

PATENT NO.        : 10,301,717 B2
APPLICATION NO.   : 14/313093
DATED             : May 28, 2019
INVENTOR(S)       : James DeCoux et al.

Page 1 of 1

It is certified that error appears in the above-identified patent and that said Letters Patent is hereby corrected as shown below:

In the Specification

| Column | Line | PTO | Should Be |
| --- | --- | --- | --- |
| 5 | 39 | "TiO2" | -- $TiO_2$ -- |

Signed and Sealed this
Twenty-fourth Day of September, 2019

Andrei Iancu
*Director of the United States Patent and Trademark Office*